United States Patent [19]
Saunders et al.

[11] Patent Number: 5,261,115
[45] Date of Patent: Nov. 9, 1993

[54] MULTI-BOARD SYSTEM WITH SHIFT BOARD SELECTION

[75] Inventors: Steven E. Saunders, Cupertino; Robert D. Alkire, San Jose; Louis F. Roehrs, Fremont, all of Calif.

[73] Assignee: Apple Computer, Inc., Cupertino, Calif.

[21] Appl. No.: 781,704

[22] Filed: Oct. 22, 1991

[51] Int. Cl.$^5$ ............................................. G06F 12/06
[52] U.S. Cl. ..................................... 395/800; 364/238; 364/254.4; 364/957.2
[58] Field of Search ... 395/200 MS File, 325 MS File, 395/425 MS File, 725 MS File, 800 MS File

[56] References Cited

U.S. PATENT DOCUMENTS

| | | | |
|---|---|---|---|
| 4,155,115 | 5/1979 | Wilske | 395/800 |
| 4,156,926 | 5/1979 | Hartman | 395/425 |
| 4,755,934 | 7/1988 | Inoue | 395/275 |
| 4,760,553 | 7/1988 | Buckley | 395/575 |
| 4,905,182 | 2/1990 | Fitch | 364/DIG. II |
| 4,937,785 | 6/1990 | Deering | 395/325 |
| 5,151,986 | 9/1992 | Langan | 395/775 |

*Primary Examiner*—David Y. Eng
*Attorney, Agent, or Firm*—Blakely, Sokoloff, Taylor & Zafman

[57] ABSTRACT

A multi-board computer system is described which comprises a main circuit board, a first circuit board having a third surface and a fourth surface opposite the third surface, and a second circuit board having a fifth surface. The main circuit board further includes means for generating a first board select signal to select the first circuit board and a second board select signal to select the second board. The first circuit board further includes a first input pin and a second input pin on the third surface, and a first output pin on the fourth surface. The first input pin corresponds to the first output pin. The first input pin is coupled to receive the first board select signal, and the second input pin is coupled to receive the second board select signal. The first circuit board is selected when it receives the first board select signal at the first input pin. The second circuit board further includes a third input pin. The third input pin is coupled to the first output pin of the first circuit board. The second circuit board is selected when it receives the second board select signal at the third input pin. The first circuit board further includes position shifting means for coupling the second board select signal from the second input pin of the first circuit board to the first output pin of the first circuit board. When the second input pin of the first circuit board receives the second board select signal, the position shifting means couples the second board select signal to the third input pin of the second circuit board via the first output pin. A method of selecting a circuit board in the multi-board computer system is also described.

14 Claims, 3 Drawing Sheets

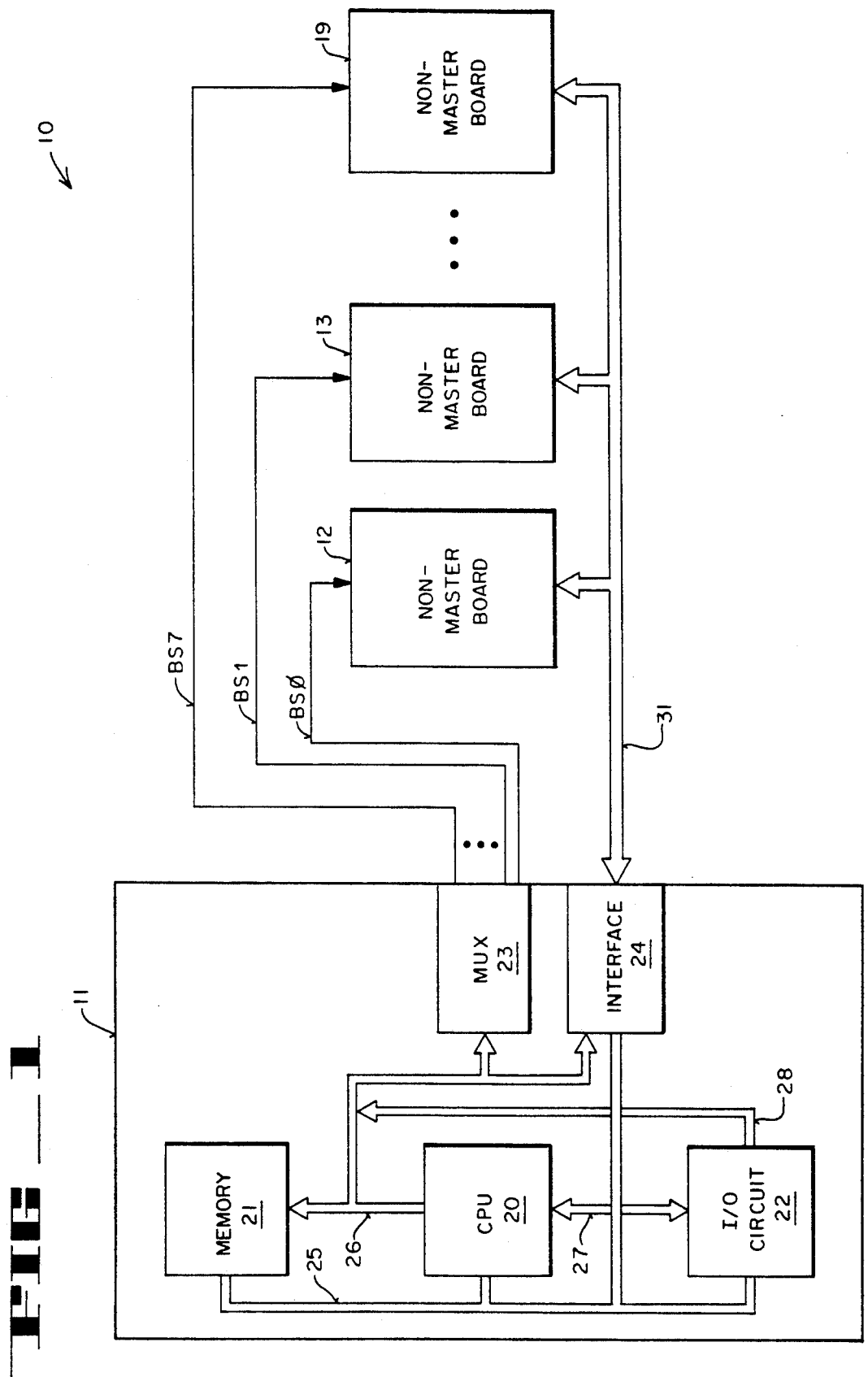

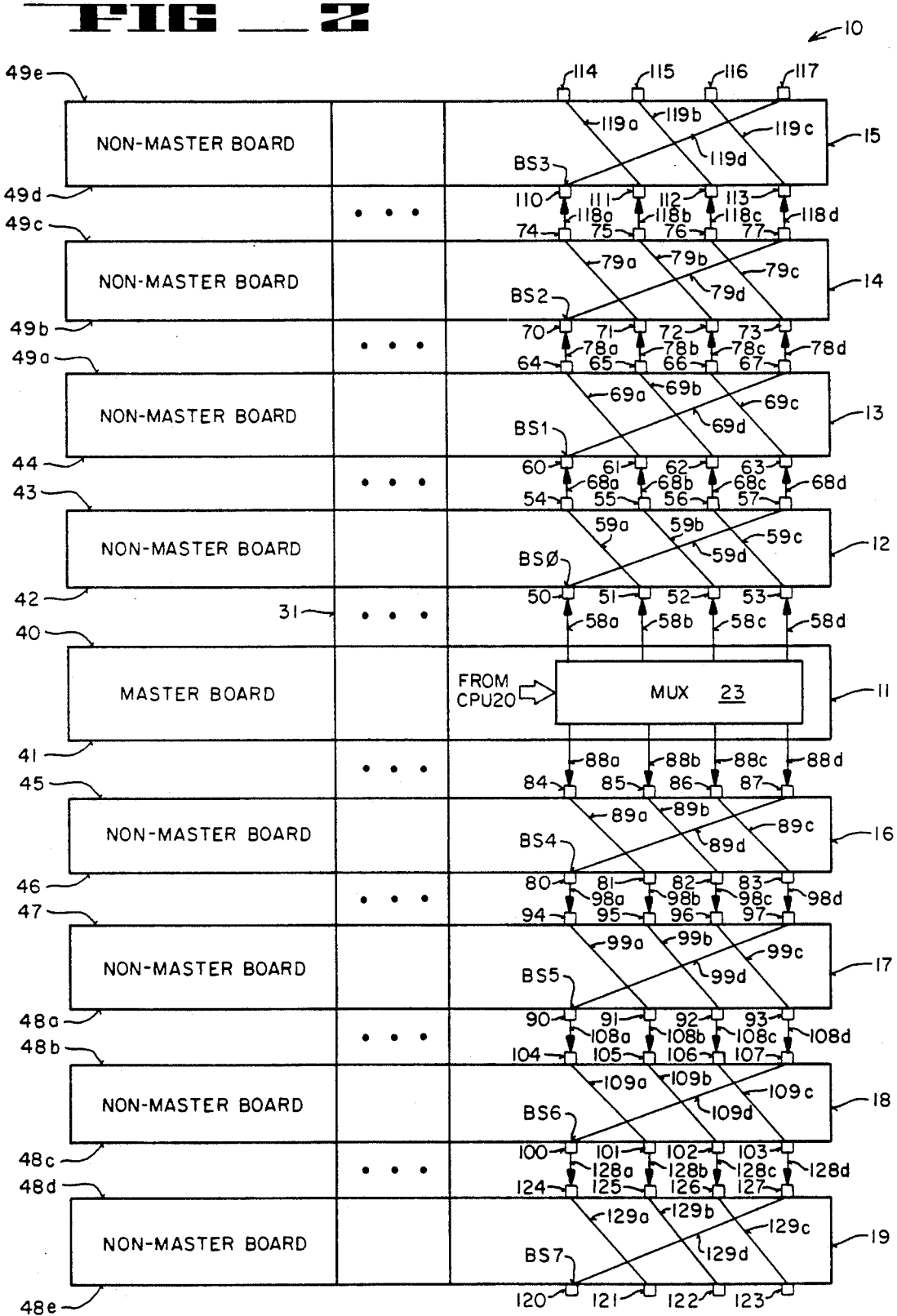

FIG_3
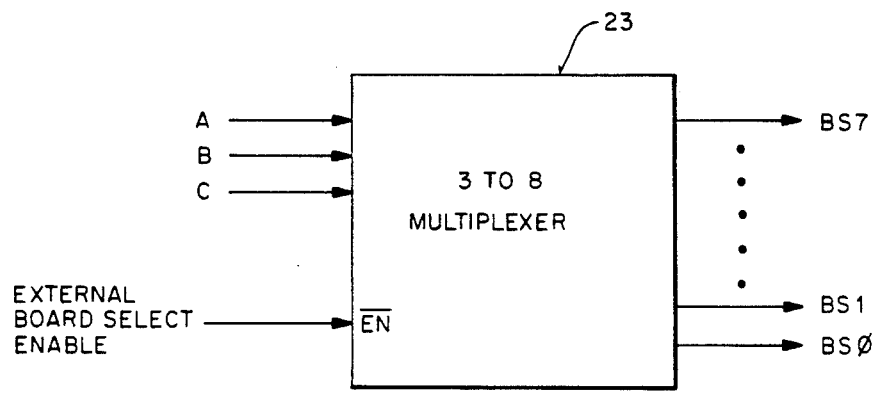
FIG_4
| EN | C | B | A | BS7 | BS6 | BS5 | BS4 | BS3 | BS2 | BS1 | BS0 |
|---|---|---|---|---|---|---|---|---|---|---|---|
| 1 | X | X | X | 0 | 0 | 0 | 0 | 0 | 0 | 0 | 0 |
| 0 | 0 | 0 | 0 | 0 | 0 | 0 | 0 | 0 | 0 | 0 | 1 |
| 0 | 0 | 0 | 1 | 0 | 0 | 0 | 0 | 0 | 0 | 1 | 0 |
| 0 | 0 | 1 | 0 | 0 | 0 | 0 | 0 | 0 | 1 | 0 | 0 |
| 0 | 0 | 1 | 1 | 0 | 0 | 0 | 0 | 1 | 0 | 0 | 0 |
| 0 | 1 | 0 | 0 | 0 | 0 | 0 | 1 | 0 | 0 | 0 | 0 |
| 0 | 1 | 0 | 1 | 0 | 0 | 1 | 0 | 0 | 0 | 0 | 0 |
| 0 | 1 | 1 | 0 | 0 | 1 | 0 | 0 | 0 | 0 | 0 | 0 |
| 0 | 1 | 1 | 1 | 1 | 0 | 0 | 0 | 0 | 0 | 0 | 0 |

MULTI-BOARD SYSTEM WITH SHIFT BOARD SELECTION

FIELD OF THE INVENTION

The present invention pertains to the field of multi-board systems. More particularly, this invention relates to a scheme of selectively addressing a board in a multi-board computer system by a main board for data communication between the main board and the addressed board.

BACKGROUND OF THE INVENTION

Normally, a computer or digitally operable processing system includes a plurality of printed circuit boards ("PCBs") and the system is referred to as multi-board system. Typically, a multi-board system includes a master printed circuit board ("master board") on which a central processing unit (CPU) microprocessor, a memory unit, and other circuitry units generally associated with the system are typically arranged. Other PCBs in the system may include peripheral expansion boards that are coupled to the peripheral devices of the system for handling additional input/output operations of the system, and memory expansion boards that contain extra memory space for the system. These PCBs in the system are generally referred to as non-master boards. The non-master boards in the system are typically connected with the master board, and are controlled by the CPU to communicate with the units on the master board.

One prior multi-board system architecture is referred to in U.S. Pat. No. 4,905,182, issued on Feb. 27, 1990. This prior architecture includes a main circuit board ("mother board") on which slots are provided for expansion. When needed, expansion cards are placed into the slots, whereby forming the multi-board system. Each card plugged into the slots of the mother board may communicate with other cards and with the mother board through a bus system when selected by a board select signal, wherein the bus system may be a NUBUS bus system.

One disadvantage associated with the prior architecture is that a decoder and a comparator are required on each of the cards placed into the slots to receive its respective board select signal. In order to allow the cards to distinguish among themselves without jumper cables or switches, each slot is assigned a slot identification number. Each time an address appears on the bus, the decoder on the card decodes it which then is compared by the comparator of the card to the slot identification number of the slot into which the card is plugged. If the comparison results in a match, a chip select signal for the particular card is then locally generated by the comparator. The card is then selected and allowed to be addressed. The incorporation of the decoder and comparator requires additional hardware overhead for each expansion card and extra board area is required on each card to accommodate the additional hardware overhead.

Another prior multi-board system architecture is referred to in U. K. patent application GB 2,103,397A, published on Feb. 16, 1983. The prior architecture disclosed in FIG. 1 of the U. K. patent application includes a processing unit which can have access to different numbers of memory units over a common data bus. The processing unit can address the memory units with select signals over individual leads of an address bus. When a select signal appears on a particular lead that is coupled to one memory unit, the memory unit is selected.

One disadvantage associated with this prior architecture is that fixed or preassigned slot connections are required to couple each individual select signal to its respective unit. In order for a unit to be selected in the system, each unit needs to be coupled to a prearranged signal line to receive its select signal. Moreover, identification code is required for each slot to indicate if a unit is plugged in the slot. In addition, because of the fixed and preassigned slot configuration of the system, vacant slots are required in the system to anticipate future expansion.

Another prior multi-board system architecture which does not require any slots employs an UNIBUS bus system that serially connects the master board with other non-master boards (i.e., chained). Each expansion board includes a comparator and stores an identification code. When the master board decides to select a particular non-master board on the chain, it sends out a select signal corresponding to the identification code of that particular board. The first coupled board to the master board receives the select signal first. The board then compares the select signal against its identification code by an comparator. If they match, the board then accepts the signal as its select signal and blocks the signal from being transferred to the next connected board via the bus. If they do not match, the board then passes the select signal onto the next connected board until the select signal reaches the board that contains the matching identification code.

One disadvantage of this prior system is the logic delays which, in some cases, can be extremely long. For example, assuming the system includes n number of boards coupled serially to the master board via the UNIBUS bus and the logic delay of the select signal on each board is T, the total logic delay will be nT when the last board on the chain is selected.

Another disadvantage of this prior system is that no vacancy along the chain is allowed. If an intervening board is missing in the system, either a dummy board or a jumper is required to complete the chain and carry the select signal to the next connected board.

SUMMARY AND OBJECTS OF THE INVENTION

One of the objects of the present invention is to provide a multi-board system having a master board and non-master boards that requires minimum hardware overhead to selectively enable a non-master board with minimum power consumption.

Another object of the present invention is to provide a multi-board system having a master board and non-master boards that does not require personalized boards or slots for the board selection.

Another object of the present invention is to provide a multi-board system having a master board and non-master boards that is automatically contiguous and obtains no intervening vacant slot position in the connection.

A multi-board system is described which, in one embodiment, comprises a main circuit board having a first surface, a first circuit board having a third surface and a fourth surface opposite the third surface, and a second circuit board having a fifth surface. The first circuit board is positioned with the third surface facing the first surface of the main circuit board. The second circuit board is positioned with its fifth surface facing the fourth surface of the first circuit board. The main circuit board further includes means for generating a first board select signal to select the first circuit board and a second board select signal to select the second board. The first circuit board further includes a first input connector means and a second input connector means on the third surface, and a first output connector means on the fourth surface. The first input connector means corresponds to the first output connector means. Each of the connector means may be a conventional pin or pad, or socket, or bump, or an elastic conductive coupling; in other words, it may be a means capable of providing an electrical coupling between two points. The first input connector means is coupled to receive the first board select signal, and the second input connector means is coupled to receive the second board select signal. The first circuit board is selected when it receives the first board select signal at the first input connector means. The second circuit board further includes a third input connector means. The third input connector means is coupled to the first output connector means of the first circuit board. The second circuit board is selected when it receives the second board select signal at the third input connector means. The first circuit board further includes position shifting means for coupling the second board select signal from the second input connector means of the first circuit board to the first output connector means of the first circuit board. When the second input connector means of the first circuit board receives the second board select signal, the position shifting means couples the second board select signal to the third input connector means of the second circuit board via the first output connector means.

A method of selecting a circuit board in a multi-board computer system having a main circuit board having a first surface, a first circuit board having a third surface and a fourth surface opposite the third surface, and a second circuit board having a fifth surface is described. The method comprises the steps of:

positioning the first circuit board with the third surface facing the first surface of the main circuit board, wherein the first circuit board further includes a first input pin and a second input pin on the third surface, and a first output pin on the fourth surface, wherein the first input pin corresponds the first output pin;

positioning the second circuit board with the fifth surface facing the fourth surface of the first circuit board, wherein the second circuit board further includes a third input pin, wherein the third input pin is coupled to the first output pin of the first circuit board;

generating a first board select signal to select the first circuit board and a second board select signal to select the second board on the main circuit board, wherein the first input pin is coupled to receive the first board select signal, and the second input pin is coupled to receive the second board select signal, wherein the first circuit board is selected when it receives the first board select signal at the first input pin; and position shifting by position shifting means the second board select signal on the second input pin of the first circuit board to the first output pin of the first circuit board, wherein when the second input pin of the first circuit board receives the second board select signal, the position shifting means couples the second board select signal to the third input pin of the second circuit board via the first output pin, wherein the second circuit board is selected when it receives the second board select signal at the third input pin.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a block diagram that shows a multi-board system;

FIG. 2 illustrates the board arrangement of the multi-board system, including a master board and a plurality of non-master boards;

FIG. 3 is a schematic diagram of a three to eight multiplexer employed in the master board to generate board select signals for the non-master boards;

FIG. 4 is a logic table showing the relationship of the inputs and the outputs of the multiplexer of FIG. 3.

DETAILED DESCRIPTION

FIG. 1 illustrates in block diagram form a multi-board computer system 10, which implements a preferred embodiment of the present invention. In FIG. 1, multi-board system 10 is a multi-board computer system that includes units arranged on a master board 11 and a plurality of non-master boards. In the presently preferred embodiment, multi-board system 10 includes eight non-master boards 12 through 19. In alternative embodiments, multi-board system 10 may include more or fewer than eight non-master boards.

System 10 typically includes, on master board 11, a central processing unit 20 (CPU 20), which is usually a microprocessor, such as the microprocessors 68020 (Motorola) and 80386 (Intel). In functional terms, CPU 20 is the central processing unit for computer system 10.

Master board 11 of system 10 further includes a memory unit 21 and an input/output (I/O) circuit 22.

Memory unit 21 is used to store the operating system of computer system 10 as well as other programs, such as file directory routines and application programs, and data transferred from peripheral devices coupled to I/O circuit 22. Memory unit 21 may include ROM which is used to store the operating system of computer system 10. Memory unit 21 may include RAM which is utilized as the internal memory of computer system 10 for accessing data and application programs. Memory unit 21 may include or be comprised of other types of memory devices.

CPU 20 is coupled to memory unit 21 via data bus 25 to permit CPU 20 to read data from and write data into memory unit 21. CPU 20 is coupled to memory unit 21 via address bus 26 to provide addresses of memory locations. Data (which includes computer program instructions) from the addressed memory locations is provided by memory unit 21 into data bus 25. Data bus 25 is a bidirectional data bus which is coupled to CPU 20, memory unit 21, and I/O circuit 22 for transfer of data among these units. CPU 20 may write to memory unit 21 by first providing an address over address bus 26 which addresses memory locations in memory unit 21 according to the address over address bus 26 and then writing into memory unit 21 by providing data over data bus 25 to memory unit 21. As is well-known, certain signals from CPU 20, which may be carried over address bus 26, indicate whether CPU 20 is writing to memory unit 21 or reading from memory unit 21.

I/O circuit 22 is coupled to CPU 20 via bus 27 and via data bus 25. Bus 27 is employed for transferring control signals from CPU 20 to I/O circuit 22 and interrupts from I/O circuit 22 to CPU 20. I/O circuit 22 is coupled to memory unit 21 via bus 28. I/O circuit 22, as is well known in the prior art, is used to interface CPU 20 and memory unit 21 to receive data from and provide data to its peripheral units. I/O circuit 22 may be utilized to provide access to peripheral devices, such as disk drives, printers, modems, video displays and other peripheral units for use with the system 10. I/O circuit 22 provides data to CPU 20 and memory unit 21 and receives data from CPU 20 and memory unit 21. The buses 25 through 28 allow CPU 20 to address the peripheral units attached to I/O circuit 22 and allow I/O circuit 22 to address memory unit 21. Thus, the peripheral units, for example, a disk drive, can exchange data (which includes programs) with CPU 20 and memory unit 21.

In one preferred embodiment, I/O circuit 22 is a conventional, intelligent input/output interface circuit. CPU 20 controls the operation of I/O circuit 22 with its respective peripheral devices by sending commands via bus 27 to circuit 22. The data transfer between I/O circuit 22 and its peripheral units generates interrupts in I/O circuit 22 and the interrupts are coupled to CPU 20 via bus 27.

Bus 25 couples CPU 20, memory 21, and I/O circuit 22 to interface 24 and bus 26 couples CPU 20 to multiplexer 23. Buses 26 and 28 couple CPU 20 and I/O circuit 22 to interface 24. Interface 24 and multiplexer 23 will be described in detail below.

In alternative embodiments, master board 11 may include more or fewer units. For example, master board 11 may only have CPU 20. In this situation, units on non-master boards 12 through 19 will provide all I/O interface to peripheral devices and memory storage for CPU 20 on master board 11.

Non-master boards 12 through 19 generally include expansion units (not shown) of system 10. Non-master boards 12 through 19 are coupled to master board 11 via bus 31 to provide expansion capability of system 10. Non-master boards 12 through 19 each may be a peripheral expansion board that contains I/O circuit to couple to peripheral devices, a memory expansion board that includes extra memory space, or a processor expansion board that includes a microprocessor unit to assist CPU 20. Each of non-master boards 12 through 19 may itself be a microprocessor that includes a microprocessor, a memory unit, and circuitry generally associated with the microprocessor. Non-master boards 12 through 19 may also be a combination of peripheral expansion boards, memory expansion boards, and microprocessor expansion boards.

As can be seen from FIG. 1, non-master boards 12 through 19 are coupled to master board 11 via bus 31. Bus 31 is a bidirectional bus which transmits data and addresses between master board 11 and non-master boards 12 through 19. CPU 20 on master board 11 selectively communicates with the units on one of non-master boards 12 through 19 via bus 31 at one time. I/O circuit 22 may also selectively communicate with non-master boards 12 through 19 via bus 31. Interface 24 on master board 11 interfaces with bus 31.

The direction of data transfer of bus 31 is controlled from CPU 20 on master board 11. In one embodiment, bus 31 is used on a multiplex basis in different time intervals for either addressing or data transfer. The multiplexing is performed by interface 24 which is also controlled by CPU 20 on master board 11. In another embodiment, separate data bus and address bus may be provided to form bus 31. In this case, interface 24 couples data bus 25 to the data bus of bus 31 and address bus 26 to the address bus of bus 31.

System 10 further includes eight board select signals BS0 through BS7. As can be seen from FIG. 1, multiplexer 23 of master board 11 provides these signals. The BS0 signal is coupled to non-master board 12, the BS1 signal is coupled to non-master board 13, and the BS7 signal is coupled to non-master board 19. These signals BS0 through BS7 are the board select signals from master board 11 that selectively enable one of non-master boards 12 through 19 to communicate with master board 11 via bus 31 at a time. The board select signals BS0 through BS7 are active high and are generated by multiplexer 23 on master board 11. Multiplexer 23 is controlled by CPU 20 to issue one board select signal among the BS0 through BS7 signals to select a non-master board from non-master boards 12 through 19. For example, if non-master board 12 is a memory expansion board which contains extra memory unit for CPU 20 and CPU 20 intends to access the memory unit on board 12, CPU 20 controls multiplexer 23 to send a logical high board select signal BS0 to non-master board 12. The memory unit on board 12 is then enabled by the board select signal BS0 and starts to be read from or write to by CPU 20 via bus 31. The circuitry of multiplexer 23 and its function to generate the board select signals BS0 through BS7 will be described in more detail below, in conjunction with FIG. 3 and 4.

During operation, when CPU 20 or I/O circuit 22 needs to access units on one of non-master boards 12 through 19, CPU 20 generates a board select enable signal and a board address to multiplexer 23 via bus 26. Multiplexer 23 is enabled by the enable signal and decodes the board address to generate a logical high board select signal among its board select output signals BS0 through BS7. For example, when non-master board 13 is to be selected. CPU 20 applies the enable signal to enable multiplexer 23. CPU 20 meanwhile couples board address of board 13 to multiplexer 23. Multiplexer 23 receives the board address and decodes the address to generate a logical high board select signal BS1. The logical high BS1 signal is then coupled to non-master board 13 to enable the board. When board 13 is selected by the logical high BS1 signal, units on board 13 are enabled to exchange data with CPU 20 or I/O circuit 22 via bus 31.

In the presently preferred embodiment, multiplexer 23 includes an external board select enable input $\overline{EN}$ and three board address inputs (both shown in FIG. 3). The $\overline{EN}$ input and the board address inputs of multiplexer 23 are coupled to CPU 20 via bus 26. When CPU 20 intends to select a particular one of non-master boards 12 through 19, it generates the board select enable signal and couples the signal to the $\overline{EN}$ input of multiplexer 23. Multiplexer 23 is then enabled to receive a board address of the particular non-master board from CPU 20 at its board address inputs.

Once one of non-master boards 12 through 19 is selected by CPU 20 via multiplexer 23, the selected non-master board is enabled to communicate with master board 11 via bus 31. Other deselected non-master boards of boards 12 through 19 remain disabled and do not have access to bus 31.

The operating system running on CPU 20 of the multi-board computer system 10 takes care of basic tasks, such as starting the system, handling interrupts, transferring data among units in the system 10, and managing the memory space in the system 10. In the presently preferred embodiment, the operating system further provides system start-up check program. The system start-up check program checks, at every power up of the computer system 10, how many of non-master boards 12 through 19 are coupled to master board 11 in the system 10. If a non-master board is determined uncoupled to the system 10 by the system start-up check program, one of the board select addresses is invalidated and will never be generated until the address becomes valid.

In the presently preferred embodiment, the system 10 includes two groups of board select addresses, one group for the board select signals BS0 through BS3 and the other for the board select signals BS4 through BS7. If one of boards 12 through 15 is determined to be uncoupled to the system 10 by the system start-up check program, it invalidates the board select address corresponding to the board select signal BS3 in the first group. Likewise, if two of boards 12 through 15 are not coupled to the system 10, the program invalidates the board addresses corresponding to the board select signals BS2 and BS3. If three of boards 12 through 15 are not coupled to the system 10, the program invalidates the board addresses corresponding to the board select signals BS1 through BS3. If all of boards 12 through 15 are not coupled to the system 10, the program invalidates the board addresses corresponding to all of board select signals BS0 through BS3.

If one of boards 16 through 19 is determined to be uncoupled to the system 10 by the system start-up check program, it invalidates the board select address corresponding to the board select signal BS7 in the second group. Likewise, if two of boards 16 through 19 are determined not to be coupled to the system 10, the program invalidates the board addresses corresponding to the board select signals BS6 and BS7. If three of boards 16 through 19 are determined not to be coupled to the system 10, the program invalidates the board addresses corresponding to the board select signals BS5 through BS7. If all of boards 16-19 are not coupled to the system 10, the program invalidates the board addresses corresponding to all of board select signals BS4 through BS7.

Referring now to FIG. 2, multi-board system 10 is shown in assembled form to illustrate the board configuration and board connection of the present invention. In FIG. 2, non-master boards 12 through 15 are located on top of master board 11 and non-master boards 16 through 19 are located beneath master board 11. Master board 11 includes a top surface 40 and a bottom surface 41. Non-master board 12 is stacked on master board 11, having its bottom surface 42 facing top surface 40 of master board 11. Non-master board 13 is then stacked on non-master board 12, having its bottom surface 44 facing the top surface 43 of non-master board 12. Likewise, non-master board 14 is stacked on top of non-master board 13. Non-master board 15 forms the top board of the stacked multiboard system 10.

On the other hand, non-master board 16 is placed beneath master board 11, having its top surface 45 facing the bottom surface 41 of master board 11. Non-master board 17 is placed beneath board 16, having its top surface 47 facing the bottom surface 46 of board 16. Likewise, non-master board 18 stacks beneath board 17. Non-master board 19 forms the bottom board of the stacked multiboard system 10. Other physical arrangements may be used in accordance with the invention; for example, the boards may not be stacked but rather are arranged in the manner of NUBUS cards in a standard NUBUS system, where the cards are each vertically positioned on the main circuit board and are each perpendicular to the main board.

Bus 31 passes through master board 11 and non-master boards 12 through 19. As described above, bus 31 is a bidirectional bus. When a data or an address appears on the bus from any one of boards 11 through 19, bus 31 couples the data or address to all boards 11 through 19. Which one of boards 11 through 19 receives the data or address is determined by the board select signals BS0 through BS7 of non-master boards 12 through 19.

In the presently preferred embodiment, non-master boards 12 through 19 each includes four connection means, such as connection pins, on both of the top and bottom surfaces of the board. The connection pins are employed in each of non-master boards 12 through 19 for receiving its own board select signal and passing through other board select signals to other non-master boards.

For example, non-master board 12 includes connection pins 50 through 53 on the bottom surface 42, and connection pins 54 through 57 on the top surface 43. Non-master board 16 likewise includes connection pins 80 through 83 on its bottom surface 46, and connection pins 84 through 87 on its top surface 45.

Each of non-master boards 12 through 19 takes its first connection pin on the bottom surface of the board as the board select input and employs it to receive the board select signal for the board from multiplexer 23. For example, connection pin 50 on the bottom surface 42 is the board select input pin of board 12 which couples the board select signal BS0 to board 12. Connection pin 60 is the board select input pin of board 13. Pin 60 couples the board select signal BS1 to board 13. Board 16 has connection pin 80 as its board select input pin. Pin 80 couples the board select signal BS4 to board 16.

Each of non-master boards 12 through 19 includes four position shifting lines that are connected between the connection pins on the bottom surface and the connection pins on the top surface. For example, board 12 includes four position shifting lines 59a through 59d. Board 13 includes four position shifting lines 69a through 69d. Board 16 includes four position shifting lines 89a through 89d. In the presently preferred embodiment, the position shifting lines on each of non-master boards 12 through 19 are conductive layers.

The position shifting lines are configured identically in each of non-master boards 12 through 19. The purpose of these position shifting lines in each of boards 12 through 19 is to couple the board select signals received at the connection pins on one surface of a board to the connection pins on the opposite surface of the board with one pin position shift. For example, position shifting line 59a on board 12 is coupled between connection pin 51 on the surface 42 and connection pin 56 on the surface 43. Position shifting line 59b is coupled between connection pins 52 and 55. Position shifting line 59c is coupled between connection pins 50 and 57. Each of position shifting lines 59a through 59c provides one pin position shift. Position shifting line 59d provides the end-around shift.

The position shifting lines in each of non-master boards 12 through 19 pass through the board select signals received by the board with one pin position shift. For example, line 59a couples the board select signal received at the second connection pin 51 on the surface 42 to the first connection pin 54 on the surface 43. Line 89a of board 16 also couples the board select signal received at the first connection pin 84 on the surface 45 to the second connection pin 81 of the surface of the surface 46.

Connection lines are provided to connect between master board 11 and non-master boards 12 through 19 for coupling the board select signals to boards 12 through 19. As can be seen from FIG. 2, connection lines 58a through 58d are connected between master board 11 and board 12. Connection lines 68a through 68d connect board 12 to board 13 and connection lines 78a through 78d connect board 13 to board 14. Connection lines 118a through 118d connect board 14 to board 15.

Connection lines 88a through 88d are connected between master board 11 and non-master board 16. Board 16 is connected to board 17 via connection lines 98a through 98d. Board 17 is connected to board 18 via connection lines 108a through 108d and board 18 is connected to board 19 via connection lines 128a through 128d.

In one embodiment, the connection lines are flexible straight connection jumpers. In another embodiment, the connection lines are elastomeric connectors. Given that all of non-master boards 12 through 19 have identical board surface configuration for receiving its board select signal and for passing through other board select signals, all connectors are identical. In a further embodiment, no connection line is required for coupling the board select signals BS0 through BS7 among boards 12 through 19. Instead, the connection pins on each of 12 through 19 are directly connected to the connection pins of its corresponding boards by conductive adhesive.

During operation, multiplexer 23 applies the board select signals BS0 through BS3 to board 12 via connection lines 58a through 58d, and applies the board select signals BS4 through BS7 to board 16 via connection lines 88a through 88d. Line 58a couples the BS0 board select signal to connection pin 50 and line 58d couples the BS3 board select signal to pin 53. Line 88a, however, couples the BS7 board select signal to pin 84 an line 88d couples the BS4 signal to pin 87.

As is described above, pin 50 is the board select input pin for board 12. Pin 50 then couples the BS0 signal to board 12.

Board select signal BS1 is coupled to pin 51. Position shifting line 59a forwardly position shifts the BS1 signal to pin 54. Line 68a then couples the BS1 signal to pin 60 which is the board select input pin for board 13. The position shifting lines in boards 12 through 15 all forwardly shift the board select signals coupled to them.

Likewise, the board select signal BS2 is coupled to the board select input pin 70 of board 17 via connection lines 58c, 68b, and 70a, and via forward position shifting lines 59b and 69a. The board select signal BS3 is coupled to the board select input pin 110 via connection lines 58d, 68c, 78b, and 118a, and via position shifting lines 59c, 69b, and 79a.

The board select signals BS4 through BS7 are coupled to pins 84 through 87 via lines 88a through 88d. Line 88d couples the BS4 signal to pin 87 and line 88a couples the BS7 signal to pin 84. Since only connection pin 80 is the board select input pin of board 10, position shifting line 89d end-round couples the BS4 signal to pin 80. The BS4 signal thus coupled to board 16.

The other board select signals BS5 through BS7 pass through board 16 via position shifting lines 89a through 89c. Position shifting lines 89a through 89c backwardly shift each of the signals with one pin position. Lines 98b through 98d then couple the BS5–BS7 signals to pins 95-97 of board 17. Position shifting line 99d couples the BS5 signal to pin 90 which is the board select input pin of board 17. Position shifting lines 99b and 99c couple the BS6 and BS7 signals to pins 92 and 93, with one pin position backward shift for each signal. Lines 108c and 108d then apply the BS6 and BS7 signals to pins 106 and 107 of board 18. Position shifting line 109d couples the BS6 signal to pin 100 which is the board select input pin of board 18. Position shifting line 109c backwardly shifts the BS7 signal to pin 103 of board 18. The BS7 signal is then coupled to the board select input pin 120 of board 19 via line 128d and via position shifting line 129d. Position shifting lines in boards 16 through 19 backwardly shift the board select signals passing through them.

Although the board select signal BS0 is coupled to boards 13 through 15 via position shifting line 59d, the BS0 signal will not be shifted to any of connection pins 60, 70, and 110. Therefore, boards 13 through 15 do not receive the BS0 signal. Likewise, although the board select signal BS4 is coupled through boards 17 through 19, the signal will not be shifted to connection pins 90, 100, and 120. Thus, boards 17 through 19 do not receive the BS4 signal. Non-master boards 12 through 19 therefore each maintains the identical board configuration and connection for receiving its board select signal and for passing through other board select signals to other non-master boards without logic processing.

As is seen from FIG. 2, boards 12 through 15 have direct board to board connection. Boards 16 through 19 have direct board to board connection. If one board is missing in the system 10, the system 10 is automatically reconfigured. For example, if board 13 is not coupled in the system 10, board 14 is then directly coupled to board 12 and pin 70 receives the BS1 signal as its board select signal. Pin 110 of board 15 receives the BS2 signal as its board select signal and the BS3 signal is invalid.

Likewise, if board 18 is missing in the system 10, board 19 then is directly coupled to board 17 and receives the BS6 signal as its board select signal at pin 120. The BS7 signal is invalid.

FIG. 3 illustrates in block diagram the circuitry of multiplexer 23 shown in FIGS. 1 and 2. In FIG. 3, multiplexer 23 is a three-to-eight multiplexer. Multiplexer 23 includes three board address input signals A, B, and C, and an external board select enable input $\overline{EN}$. The outputs of multiplexer 23 are the board select signals BS0 through BS7. The external board select enable input $\overline{EN}$, when actively high, enables multiplexer 23 to decode the input signals A, B, and C and outputs a logical high board select signal among BS0 through BS7 signals. The enable input $\overline{EN}$ activates multiplexer 23 when it is logical low, regardless of the A, B, and C input signals. FIG. 4 shows the relationship of the inputs A, B, and C and the output board select signals BS0 through BS7 of multiplexer 23 (X represents do not care).

The A, B, and C inputs and the enable input $\overline{EN}$ are coupled to multiplexer 23 from CPU 20 (FIG. 1) via address bus 26. CPU 20 couples the board address to the A, B, and C inputs of multiplexer 23. The A, B, and C inputs each receives a binary bit of a board address for board selection. The A, B, and C inputs combined represent eight numbers in binary form, each of which corresponds to one of board select signals BS0 through BS7.

As can be seen from the logic table in FIG. 4 when A=B=C=0 (logical low), a "000" board address is received. Multiplexer 23 decodes the number and outputs a logical high board select signal BS0. When B=C32 0 and A=1 (logical high), a "001" board address is received and multiplexer 23 outputs a logical high board select signal BS1. Likewise, when A=B=C=1, multiplexer 23 outputs a logical high board select signal BS7.

The enable input $\overline{EN}$ controls the operation of multiplexer 23. As also can be seen from FIG. 4, when the EN signal, which is the inverted signal of the $\overline{EN}$ input, is logical high, multiplexer 23 is deactivated to output any board select signal. All board select outputs BS0 through BS7 of multiplexer 23 remain logically inactive low.

Multiplexer 23 receives its A, B, and C inputs and the enable signal $\overline{EN}$ from CPU 20 of FIG. 1. Whenever CPU 20 or I/O circuit 22 intends to address a particular one of non-master boards 12 through 19, CPU 20 generates and applies a three bit binary board address to the A, B, and C inputs of multiplexer 23. CPU 20 also applies a logical high signal to the enable input $\overline{EN}$ of multiplexer 23 to activate the device. Multiplexer 23 decodes the address and outputs a logic high board select signal on one of its board select signal outputs BS0 through BS7 that is coupled to the selected non-master board. For example, assume CPU 20 intends to communicate with non-master board 13 (FIGS. 1 and 2). CPU 20 first couples a logical high $\overline{EN}$ signal to the $\overline{EN}$ input of multiplexer 23. Multiplexer 23 is activated by the logical high $\overline{EN}$ signal. CPU 23 then generates and applies a "001" address (C=B=0, A=1) to multiplexer 23. Multiplexer 23 decodes the "001" address applied at its A, B, and C inputs and outputs a logical high board select signal BS1. The logical high board select signal BS1 is then coupled to non-master board 13. Likewise, when the address received at the A, B, and C inputs of multiplexer 23 is "001" i.e., C=1, A=B=0), multiplexer 23 outputs a logical high board select signal BS6. In this case, non-master board 18 is selected.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A multi-board system, comprising:
a main circuit board having a first surface;
a first circuit board having a third surface and a fourth surface opposite the third surface, and being positioned with the third surface facing the first surface of the main circuit board;
a second circuit board having a fifth surface, and being positioned with its fifth surface facing the fourth surface of the first circuit board;
the main circuit board further including means for generating a first board select signal to select the first circuit board and a second board select signal to select the second circuit board;
the first circuit board further including a first input connector means and a second input connector means on the third surface, and a first output connector means on the fourth surface, wherein the first input connector means corresponds to the first output connector means, wherein the first input connector means is coupled to receive the first board select signal, and the second input connector means is coupled to receive the second board select signal, wherein the first circuit board is selected when it receives the first board select signal at the first input connector means;
the second circuit board further including a third input connector means, wherein the third input connector means is coupled to the first output connector means of the first circuit board, wherein the second circuit board is selected when it receives the second board select signal at the third input connector means; and
the first circuit board further including position shifting means for coupling the second board select signal from the second input connector means of the first circuit board to the first output connector means of the first circuit board, wherein when the second input connector means of the first circuit board receives the second board select signal, the position shifting means couples the second board select signal to the third input connector means of the second circuit board via the first output connector means.

2. The system of claim 1, wherein the position shifting means is a forward shifting means.

3. The system of claim 1, wherein the position shifting means is a backward shifting means.

4. The system of claim 1, wherein the generating means is a multiplexer and wherein each of said connector means is one of a pin and a pad.

5. The system of claim 1, further comprising connection means connected between the main circuit board and the first circuit board and between the first circuit board and the second circuit board for coupling the first board select signal and the second board select signal to the first circuit board and the second circuit board from the main circuit board.

6. The system of claim 5, wherein the connection means is a flexible jumper.

7. The system of claim 5, wherein the connection means is an elastomeric connector.

8. The system of claim 5, wherein the connection means is an electrically conductive adhesive.

9. The system of claim 1, wherein the main circuit board further includes a second surface opposite the first surface, wherein the system further comprises a third circuit board and a fourth circuit board positioned facing the second surface of the main circuit board.

10. The system of claim 9, wherein the generating means further generates a third board select signal for selecting the third circuit board and a fourth board select signal for selecting the fourth circuit board.

11. A multi-board computer system comprising:
a main circuit board having a CPU;

a first circuit board having a first input connector means and a second input connector means and a first output connector means;

a second circuit board having a third input connector means;

the main circuit board further including a means for generating a first board select signal to select the first circuit board and a second board select signal to select the second circuit board, wherein the first input connector means is coupled to receive the first board select signal and the second input connector means is coupled to receive the second board select signal, wherein the first circuit board is selected when it receives the first board select signal at the first input connector means, wherein the third input connector means is coupled to the first output connector means of the first circuit board, and wherein the second circuit board is selected when it receives the second board select signal at the third input connector means; and the first circuit board further including position sifting means for coupling the second board select signal from the second input connector means of the first circuit board to the first output connector means of the first circuit board, wherein when the second input connector means of the first circuit board receives the second board select signal, the position shifting means couples the second board select signal to the third input connector means of the second circuit board via the first output connector means.

12. The system of claim 11, wherein the position shifting means is a forward shifting means.

13. The system of claim 11, wherein the position shifting means is a backward shifting means.

14. A method of selecting a circuit board in a multi-board computer system having a main circuit board having a first surface, a first circuit board having a third surface and a fourth surface opposite the third surface, and a second circuit board having a fifth surface, the method comprising the steps of:

positioning the first circuit board with the third surface facing the first surface of the main circuit board, wherein the first circuit board further includes a first input pin and a second input pin on the third surface, and a first output pin on the fourth surface, wherein the first input pin corresponds to the first output pin;

positioning the second circuit board with the fifth surface facing the fourth surface of the first circuit board, wherein the second circuit board further includes a third input pin, wherein the third input pin is coupled to the first output pin of the first circuit board;

generating a first board select signal to select the first circuit board and a second board select signal to select the second board on the main circuit board, wherein the first input pin is coupled to receive the first board select signal, and the second input pin is coupled to receive the second board select signal, wherein the first circuit board is selected when it receives the first board select signal at the first input pin; and position shifting by position shifting means the second board select signal on the second input pin of the first circuit board to the first output pin of the first circuit board, wherein when the second input pin of the first circuit board receives the second board select signal, the position shifting means couples the second board select signal to the third input pin of the second circuit board via the first output pin, wherein the second circuit board is selected when it receives the second board select signal at the third input pin.

* * * * *